(12) United States Patent
Kengeri et al.

(10) Patent No.: US 6,240,008 B1
(45) Date of Patent: May 29, 2001

(54) READ ZERO DRAM

(75) Inventors: Subramani Kengeri, San Jose; Hemraj K. Hingarh, Saratoga, both of CA (US)

(73) Assignee: Silicon Access Networks, Inc., San Jose, CA (US)

( * ) Notice: Subject to any disclaimer, the term of this patent is extended or adjusted under 35 U.S.C. 154(b) by 0 days.

(21) Appl. No.: 09/590,443

(22) Filed: Jun. 9, 2000

(51) Int. Cl.[7] .............................. G11C 11/24; G11C 7/00
(52) U.S. Cl. ...................... 365/149; 365/205; 365/208
(58) Field of Search .................................. 365/149, 205, 365/207, 208

(56) References Cited

U.S. PATENT DOCUMENTS

| | | | |
|---|---|---|---|
| 5,682,343 | * 10/1997 | Tomishima et al. | 365/63 |
| 5,742,544 | * 4/1998 | Foss | 365/189.03 |
| 5,781,483 | * 7/1998 | Shore | 365/200 |

* cited by examiner

Primary Examiner—Son Mai

(74) *Attorney, Agent, or Firm*—Fernandez & Associates, LLP

(57) ABSTRACT

A dynamic random access memory (DRAM) having a conventional cell layout and having its data access path adapted to access a 'zero' faster than a 'one.' The DRAM comprising two capacitors coupled respectively to two neighboring word lines. The two capacitors are also coupled respectively to two neighboring bit lines via two pass gates. Data is represented as complementary data bits on the two capacitors. In so doing, a 'zero' is ensured to be stored in either one of the two capacitors. A voltage level 'zero' is in turn ensured to be maintained on the bit line coupled to the capacitor that stores the 'zero' data bit. The sense amplifier and the write driver take advantage of the fact that a voltage level 'zero' is ensured to be maintained in either one of the two bit lines. Each of a sense amplifier and a write driver, as parts of the DRAM's data access path, amplifies a 'zero' and a 'one' unequally by amplifying the 'zero' faster than the 'one.' Access time is thus improved. The DRAM does not need to operate in the differential sensing mode. The DRAM can operate in either the differential sensing mode or the conventional mode. The switch between the differential and the conventional sensing modes can be implemented without having to alter the cell layout of a conventional DRAM.

30 Claims, 8 Drawing Sheets

READ ZERO DRAM

FIELD OF INVENTION

The present invention relates to a dynamic random access memory (DRAM), particularly to a DRAM having data access path optimized for reading a 'zero.'

BACKGROUND OF THE INVENTION

Among the critical issues for a conventional DRAM, ratio of bit line capacitance to cell capacitance, if not well controlled, deleteriously affects the initial charge sharing time to generate the required differential signal for proper sensing. Also, in a conventional DRAM, a data bit 'one' requires longer time to restore, thereby undesirably lengthening the write cycle time. Additionally, cell leakage affecting the stored 'one,' which can hurt production ramp-up. Furthermore, even though DRAM is better than static random access memory (SRAM) in terms of available density and structural simplicity, SRAM is still better than DRAM in term of data access speed.

Thus, a need exists for an improved DRAM that offers the size advantage of DRAM without sacrificing the speed. That is, a need exists for an improved DRAM that decreases the gap between its speed and SRAM's speed. Additionally, a need exists for an improved DRAM that does not have bad ratio of BL capacitance to cell capacitance. Furthermore, a need exists for an improved DRAM that is not difficult to control the initial charge sharing time to generate the required differential for proper sensing. Further still, a need exists for an improved DRAM that does not have problem with cell leakage that affects the stored 'one' and hurts production ramp-up.

SUMMARY

The invention is drawn to a method and apparatus for improving random access cycle time and pause capability in dynamic random access memory (DRAM). Specifically, the invention provides an improved DRAM that offers the size advantage of DRAM without sacrificing the speed. That is, the invention provides an improved DRAM that decreases the gap between its speed and the speed of static random access memory (SRAM). Additionally, the invention provides an improved DRAM that does not have bad ratio of BL capacitance to cell capacitance. Furthermore, the invention provides an improved DRAM that is not difficult to control the initial charge sharing time to generate the required differential for proper sensing. Further still, the invention provides an improved DRAM that does not have problem with cell leakage to affect the stored 'one' and production ramp-up.

Preferably, a DRAM with a conventional cell layout has its data access path adapted to access a 'zero' faster than a 'one.' The DRAM comprising two capacitors coupled respectively to two neighboring word lines. The two capacitors are also coupled respectively to two neighboring bit lines (BL's) via two pass gates. Specifically, the two capacitors are utilized together to represent data as complementary data bits on the two capacitors. In so doing, a 'zero' is ensured to be stored in either one of the two capacitors. In turn, a voltage level 'zero' is ensured to be maintained on the BL coupled to the capacitor storing the 'zero' data bit.

As parts of the DRAM's data access path, each of a sense amplifier (SA) and a write driver amplifies a 'zero' and a 'one' unequally by amplifying the 'zero' faster than the 'one.' The SA and the write driver take advantage of the fact that a voltage level 'zero' is ensured to be maintained in either one of the two BL's.

The DRAM does not need to operate in the differential sensing mode. Rather, the DRAM can operate in either the differential sensing mode or the conventional mode. The switch between the differential and the conventional sensing modes can be implemented without having to alter the conventional cell layout of the DRAM.

These and other objects and advantages of the present invention will no doubt become obvious to those of ordinary skill in the art after having read the following detailed description of the preferred embodiments which are illustrated in the various drawing figures.

DETAILED DESCRIPTION OF PREFERRED EMBODIMENT(S)

Reference is made in detail to the preferred embodiments of the invention, a apparatus and method for improving random access cycle time and pause capability in a high performance DRAM. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
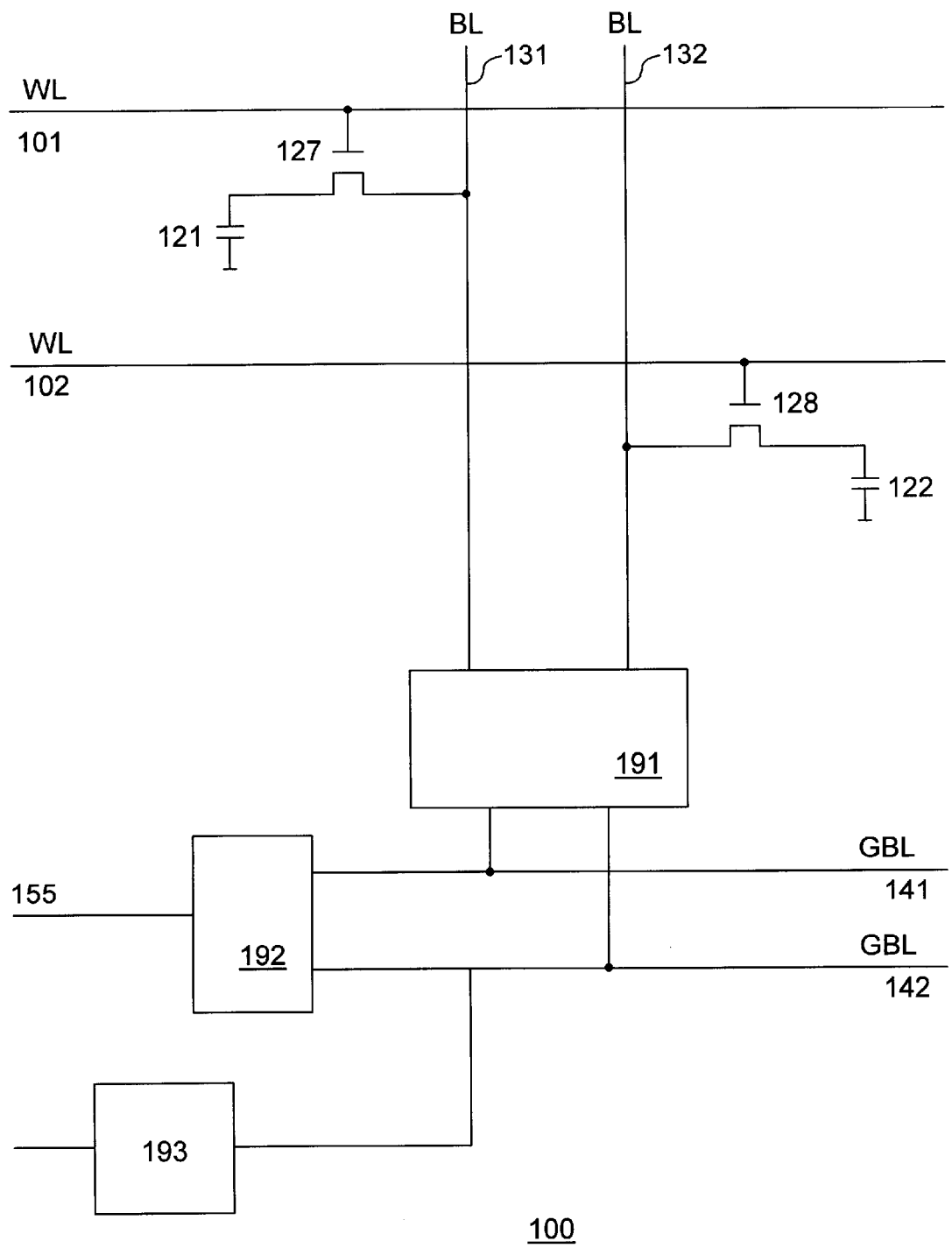
FIG. 1 depicts a schematic diagram of a DRAM system in accordance with one embodiment of the invention.

Referring now to FIG. 1, a DRAM system 100 in accordance with one embodiment of the invention is depicted as a schematic diagram. DRAM system 100 includes two capacitors 121–122. A bit line (BL) 131 is coupled to capacitor 121 via pass gate 127, while a BL 132 is coupled to capacitor 122 via pass gate 128. Pass gate 127 is switched by asserting word line (WL) 101, while pass gate 128 is switched by asserting WL 102. BL's 131–132 are coupled to pre-SA 191. Pre-SA 191 is in turn coupled to SA 192 via global bit lines (GBL's) 141–142. SA 192 is also coupled to line 155 adapted to read out data stored in capacitors 111–112. As shown, DRAM system 100 also includes a write driver 193 coupled to said GBL's 141–142.

Although DRAM system 100 has a conventional cell layout, DRAM system 100 is operable in a conventional sensing mode and a differential sensing mode. These two sensing modes of DRAM system 100 can be flexibly switched with each other. In its conventional mode, DRAM system 100 performs memory functions just like a conventional DRAM would perform. In its differential sensing mode, DRAM system 100 is adapted to perform at a much faster speed not available in the conventional sensing mode.

As understood herein, DRAM system 100 does not need to operate in the differential sensing mode. Rather, DRAM system can operate in either the differential sensing mode or the conventional mode. The switch between the differential and the conventional sensing modes can be implemented without having to alter the conventional cell layout of DRAM system 100.

Continuing with FIG. 1, in its differential mode, DRAM system 100 has its data access path adapted to access a 'zero' faster than a 'one.' Specifically, data is represented as complementary data bits on capacitors 121–122. In so doing, a 'zero' is ensured to be stored in either one of two capacitors 121–122. In turn, a voltage level 'zero' is ensured to be maintained on the BL (BL 131 or BL 132) coupled to the capacitor storing the 'zero' data bit. In other words, in contrast to the conventional DRAM implementation, none of BL 131–132 maintains a BL reference voltage. Rather, this complementary approach in the differential sensing mode ensures that at least one of the BL's is maintained at the 'zero' voltage level.

Specifically, in prior art approaches, typically one BL maintains voltage level 'one' and the other BL maintains the BL reference voltage level. Or, one BL maintains voltage level 'zero' and the other BL maintains the BL reference voltage level. Thus, the presence of a 'one' or a 'zero voltage level on a BL cannot be guaranteed. As such, in the prior art approaches, the SA must be prepared to amplify either a 'zero' or 'one.' That is, the SA cannot anticipate whether to expect, 'zero' or 'one.' As such, the SA in the prior art approaches must account for both 'zero' and 'one' equally, i.e., the SA must not favor 'one' nor 'zero' over each other. Consequently, the SA cannot be optimized to read a 'zero' for improving data accessing speed.

In the present invention, what allows the optimization of the data access path and particularly of pre-SA, SA and write driver is the fact that the two BL's are maintained at complementary voltage levels of 'zero' and 'one' (in the differential mode), instead of one of BL being maintained at BL reference voltage level and the other BL uncertain level of either 'one' or 'zero.'

Thus, each of pre-SA 191, SA 192 and write driver 193 is optimized toward reading a 'zero' in order to take advantage of the fact that a voltage level 'zero' is ensured to be maintained in either one of the two BL's 131–132. That is, as parts of the data access path in DRAM system 100, each of pre-SA 191, SA 192 and write driver 193 amplifies a 'zero' and a 'one' unequally by amplifying the 'zero' faster than the 'one.'

Specifically, pre-SA 191 is operable in a conventional sensing mode and a differential sensing mode. SA 191 is also operable in the conventional sensing mode and a differential sensing mode. Write driver 193 is operable in a conventional driving mode and a differential driving mode. In the differential sensing mode, each of pre-SA, SA 192 and write driver 193 is adapted to amplify a 'zero' and a 'one' unequally. Each of pre-SA, SA 192 and write driver 193 responds to a 'zero' faster than to a 'one.'

Moreover, capacitors 121–122 charge share and generate differential signal on first BL 131 and second BL 132. The differential signal compensates for a poorly restored value, thereby reducing write cycle time. The differential signal is approximately twice the value that is available with 1 transistor/1 capacitor (1T/1C) configured DRAM.

Figure 2:
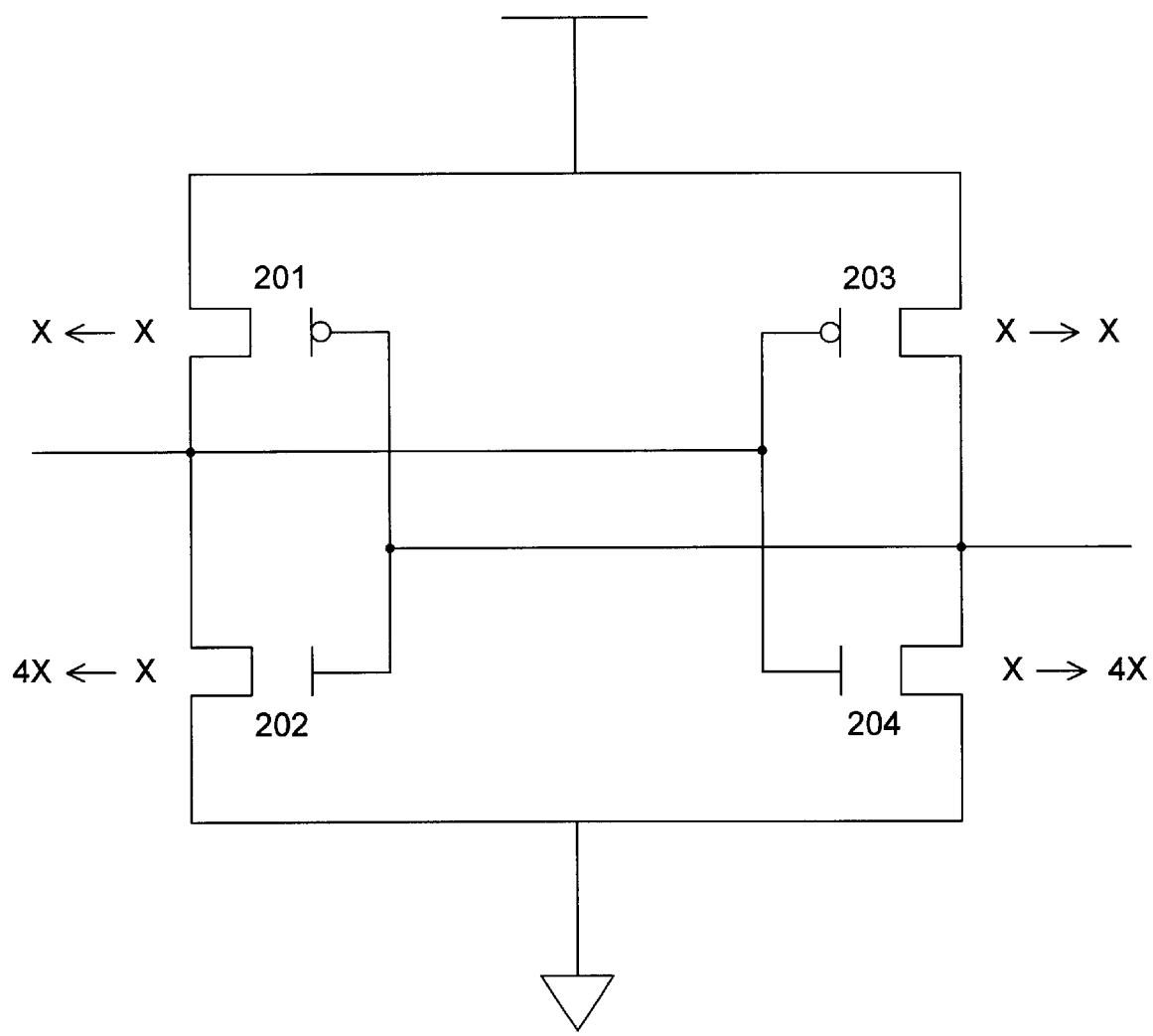
FIG. 2 depicts a pre-sense amplifier of the DRAM system shown in FIG. 1.

Referring now to FIG. 2 in view of FIG. 1, pre-SA 191 is shown in accordance with the present embodiment of the invention. Pre-SA 191 comprises gates 201–204. Each of gates 201–204 has its W/L ratio adjustment as indicated. Specifically, gate 201 and gate 203 have their WIL ratios unchanged, whereas gate 202 and gate 204 have their W/L ratios increased to 4× as before. In so doing, pre-SA responds to a 'zero' much faster than to a 'one' to favor 'zero' amplification.

Figure 3:
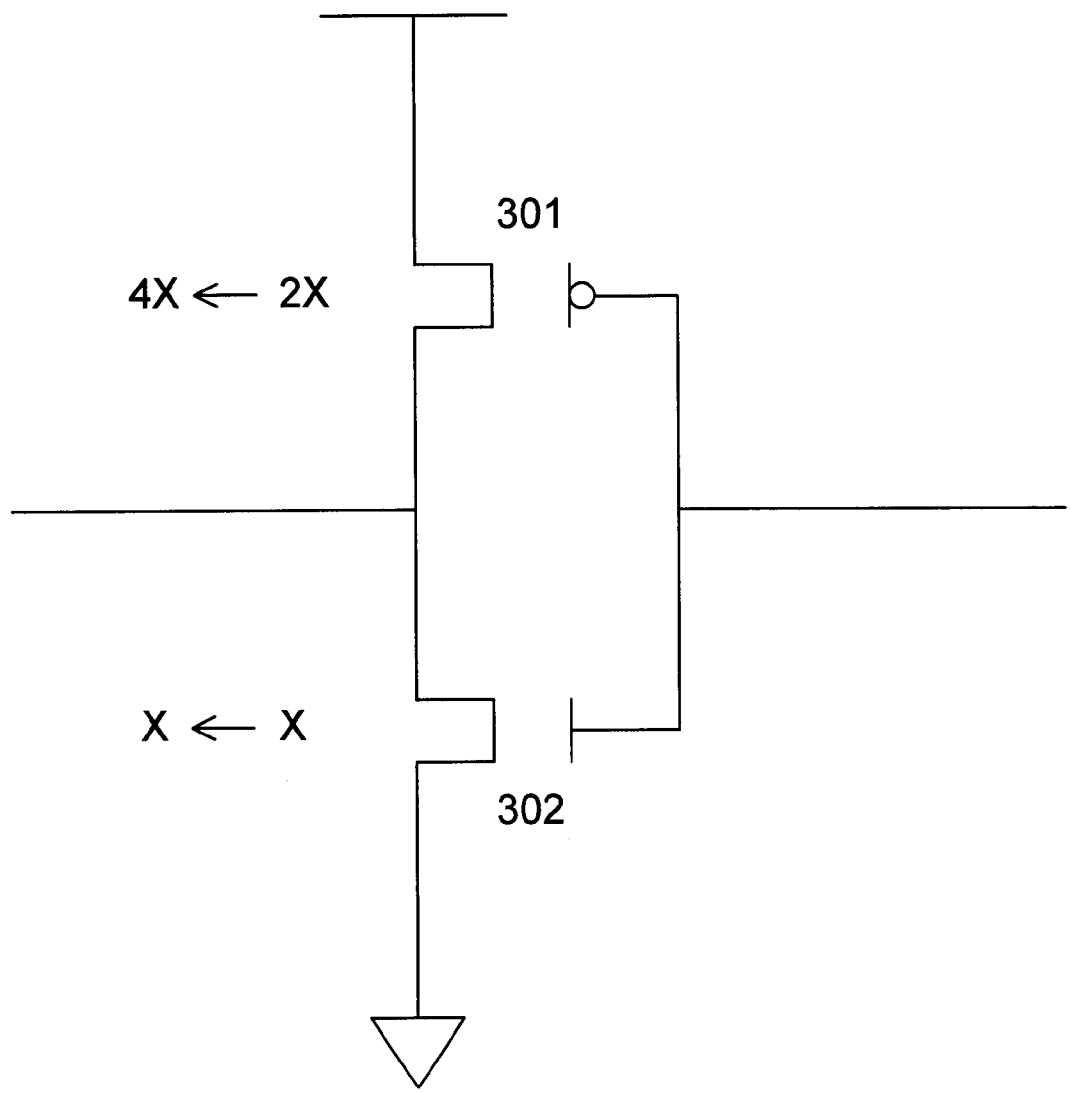
FIG. 3 depicts a read sense amplifier (SA) of the DRAM system shown in FIG. 1.

Referring now to FIG. 3 in view of FIG. 2, SA 192 is shown in accordance with the present embodiment of the invention. SA 192 comprises gates 301–302. Each of gates 301–302 has its' W/L ratio adjustment as indicated. Specifically, the W/L ratio of gate 301, which is conventionally 2× that of the W/L ratio of gate 302, is now 4× that of the W/L ratio of gate 302. In so doing, SA responds to a 'zero' much faster than a 'one' to favor 'zero' amplification.

Figure 4:
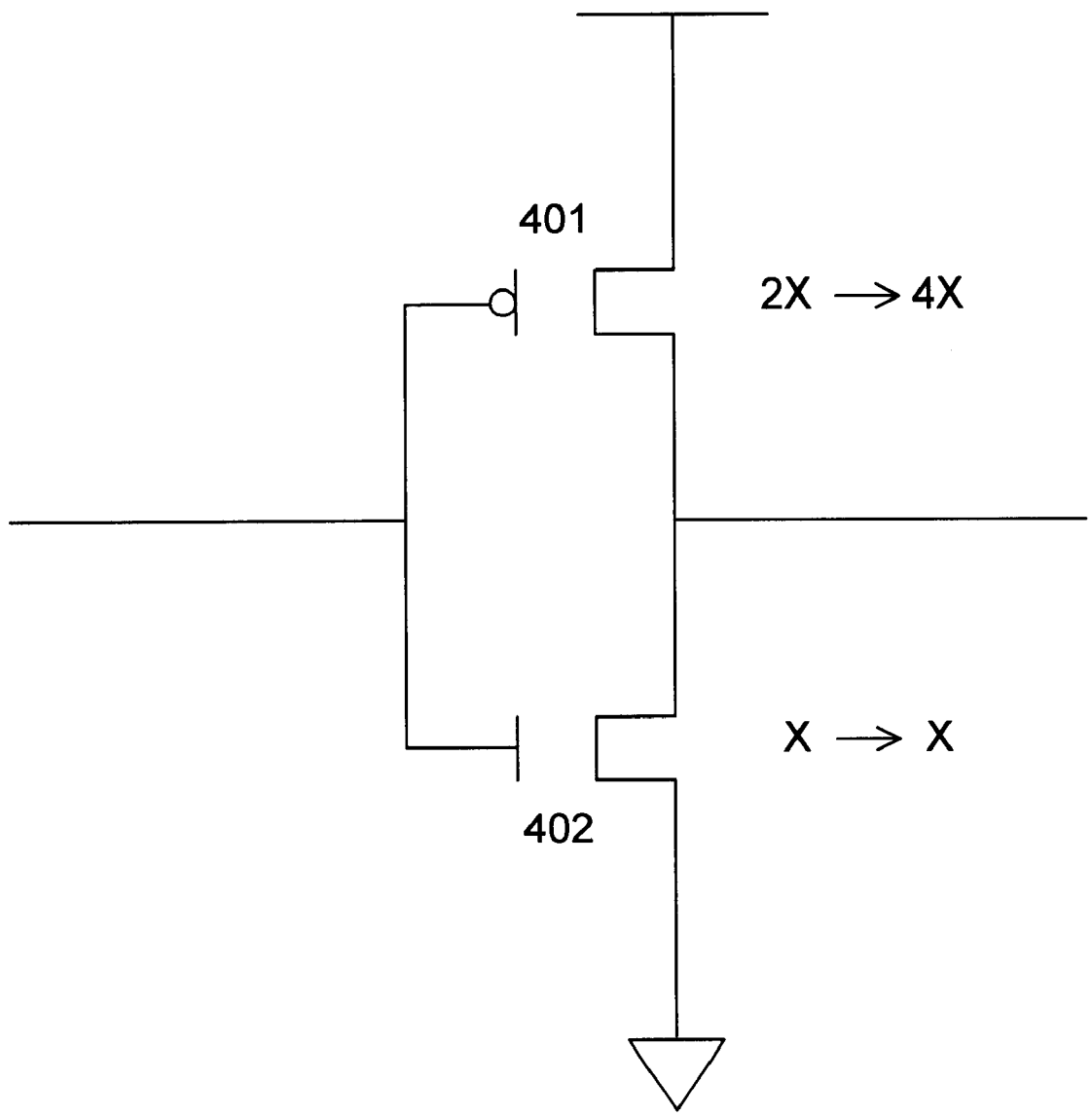
FIG. 4 depicts a write driver of the DRAM system shown in FIG. 1.

Referring now to FIG. 4 in view of FIG. 3, write driver 193 is shown in accordance with the present embodiment of the invention. Write driver 193 comprises gates 401–402. Each of gates 401–402 has its' W/L ratio adjustment as indicated. Specifically, the W/L ratio of gate 301, which is conventionally 2× that of the W/L ratio of gate 302, is now 4× that of the W/L ratio of gate 302. In so doing, SA responds to a 'zero' much faster than a 'one' to favor 'zero' amplification.

In view of FIGS. 1–4, the read/write data path is fully optimized for a 'zero' to improve the performance of DRAM system 100 having a conventional cell layout while not needing to change the cell layout of DRAM system 100.

Figure 5A:
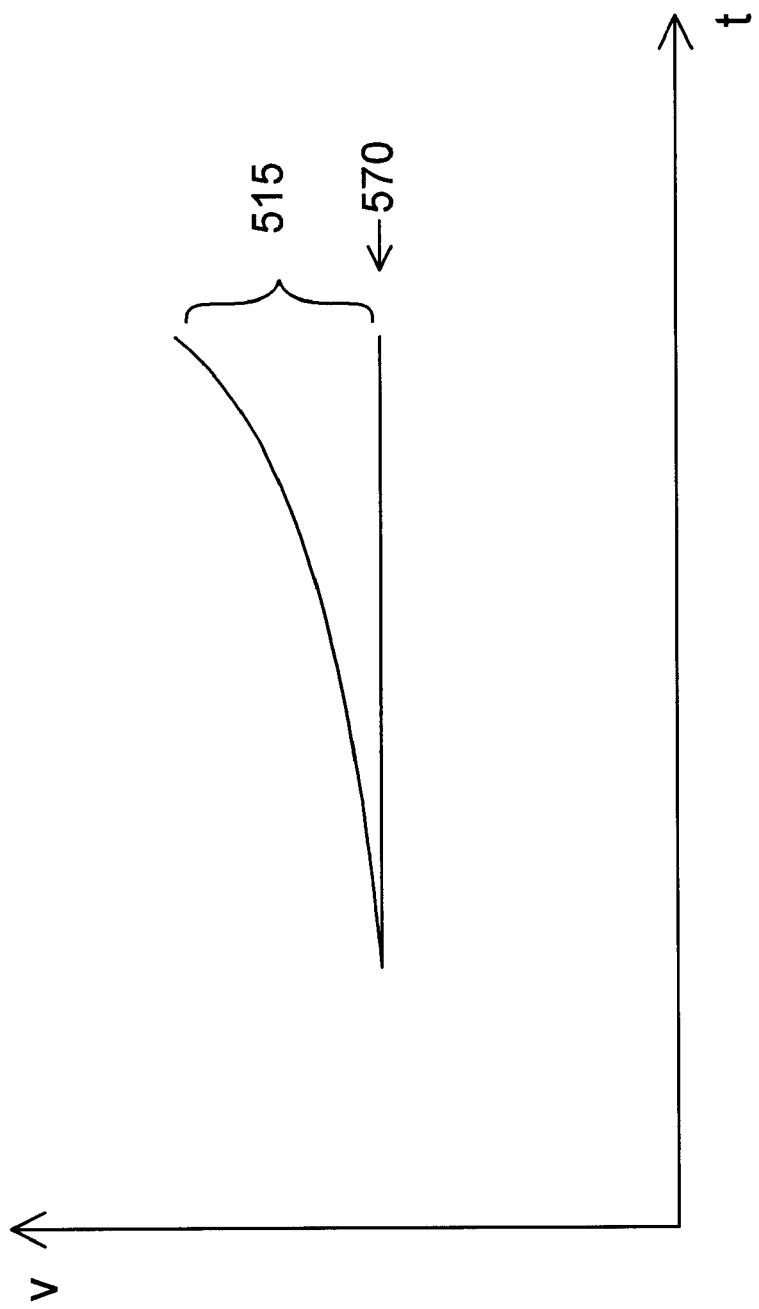
FIG. 5A depicts a voltage-time graph profiling a differential signal for a conventional SA.
Figure 5B:
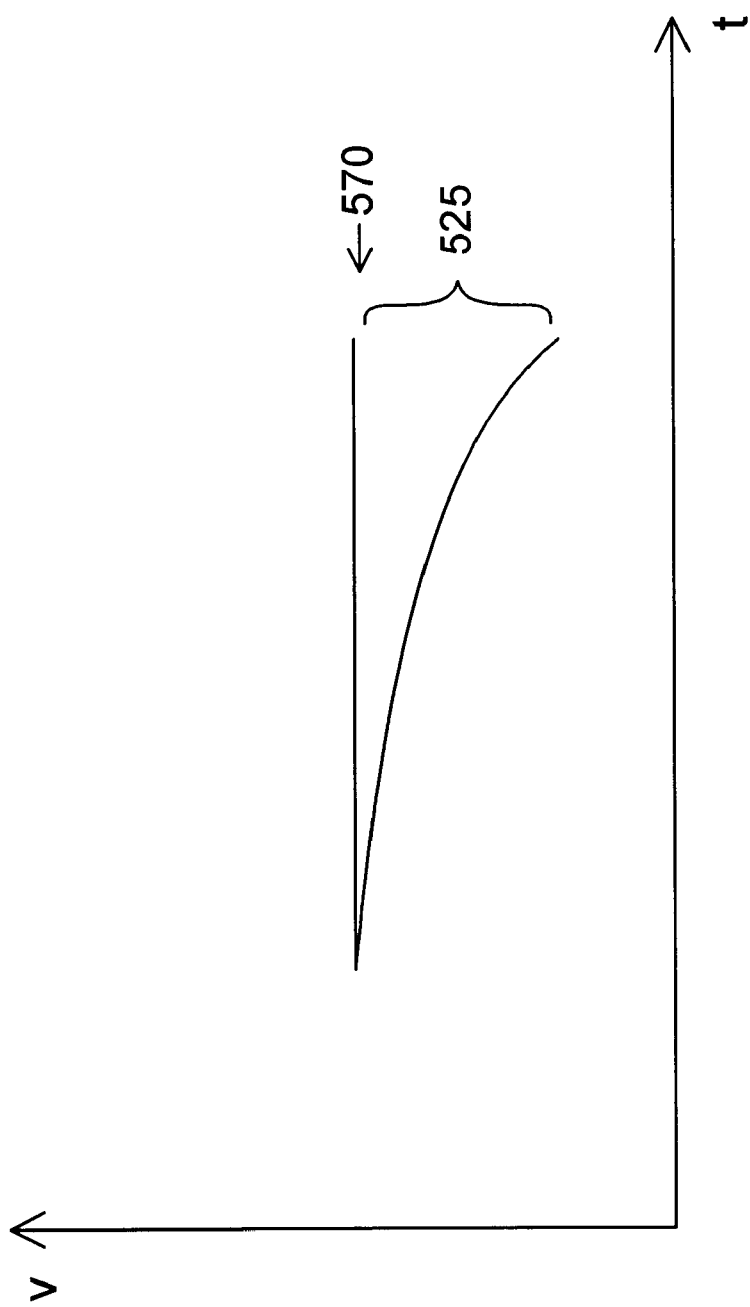
FIG. 5B depicts a voltage-time graph profiling a differential signal for a conventional SA.
Figure 5C:
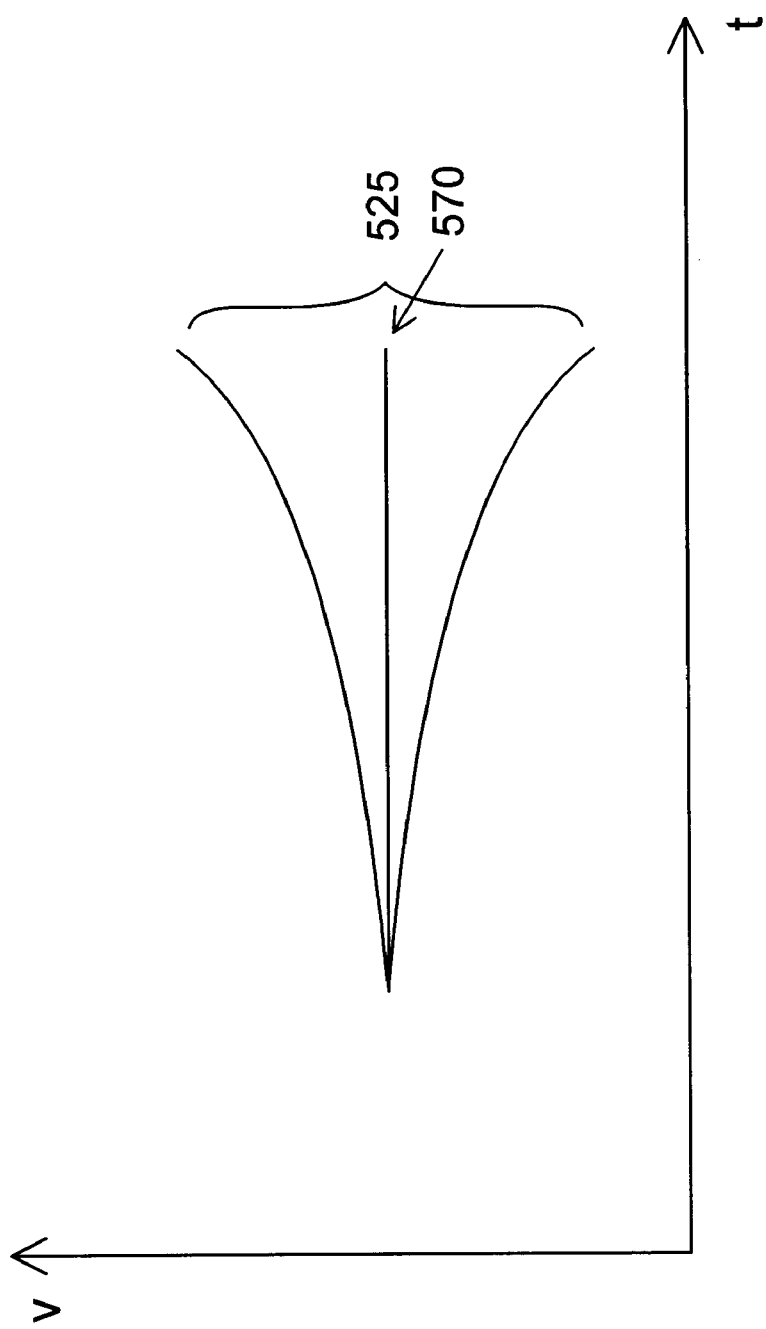
FIG. 5C depicts a voltage-time graph profiling a differential signal for a SA in accordance with one embodiment of the invention.

Referring now FIGS. 5A to 5C, voltage-time graphs are shown to contrast the conventional sensing mode with the differential sensing mode in the present embodiment of the invention.

In FIG. 5A, a voltage-time graph 510 is shown to indicate the signal differential 515 amplified by a SA in a DRAM in conventional sensing mode. The voltage of 'one' is contrasted with a BL reference voltage level 570, which is the average of the voltage levels of a 'one' and a 'zero.'

In FIG. 5B, a voltage-time graph 520 is shown to indicate another signal differential 525 amplified by a SA in a DRAM in conventional mode. The voltage of 'zero' is contrasted with the BL reference voltage level 570 described in FIG. 5A.

In FIG. 5C, a voltage-time graph 530 is shown to indicate the signal differential 535 amplified by a SA in a DRAM in differential sensing mode according to the present embodiment. Note that no BL reference voltage level is used in SA amplification. Rather, voltage level corresponding to complementary bit values are maintained on the complementary BL's. In so doing, voltage differential 535 is the difference between the voltage level of a 'one' and a 'zero.'

Referring now to FIGS. 5A, 5B and 5C together, signal differential 535 is larger than either signal differential 515 or signal differential 525. As such, in the present embodiment of the invention, signal differential 535 is approximately twice the value that is available conventionally.

Figure 6:
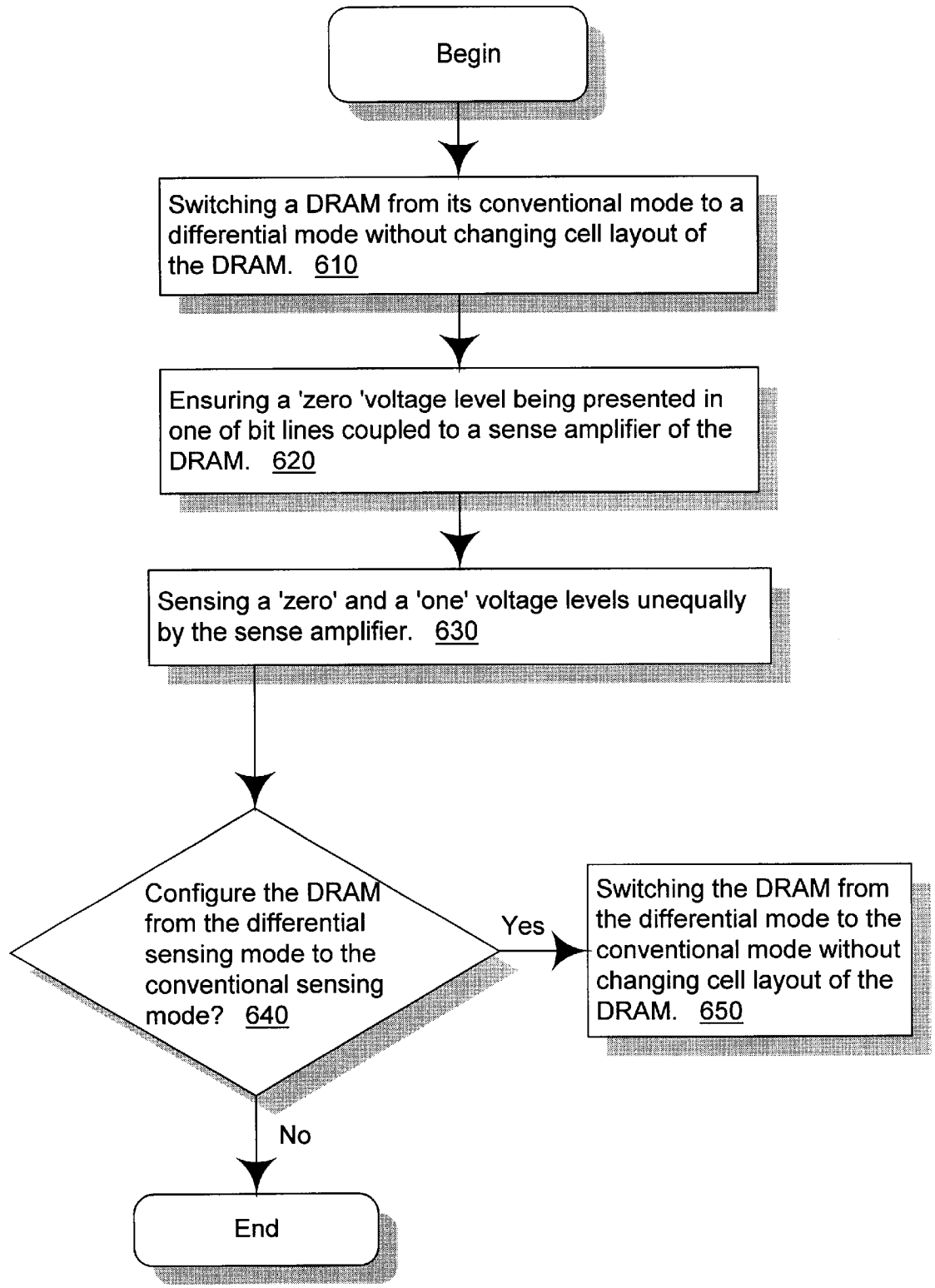
FIG. 6 is a flow chart outlining steps performed in one embodiment of the invention.

FIG. 6 is a flow chart 600 outlining the steps performed in one embodiment of the invention. These steps are performed for accessing a DRAM in accordance with the invention.

In step 610, a DRAM of one embodiment of the invention is switched from its conventional mode to a differential mode without changing cell layout of the DRAM.

In step 620, a 'zero' voltage level is ensured to present in one of BL's coupled to a SA.

In step 630, a 'zero' and a 'one' voltage levels are sensed unequally by the SA. Specifically, the SA amplified the 'zero' voltage level faster than the 'one' voltage level. The SA is able to favor sensing the 'zero' voltage level over the 'one' voltage level because the presence of the 'zero' voltage level has been ensured in step 620. In contrast, the SA of the conventional DRAM does not favor a 'zero' over a 'one' because no presence of a 'zero' voltage level is ensured.

In query step 640, decision is made as to whether to configure the DRAM from the differential sensing mode to the conventional sensing mode. If the differential mode is still desired, the flow chart terminates. Otherwise, if the conventional sensing mode of the DRAM is desired, step 650 is performed.

In step 650, the DRAM is switched from the differential mode to the conventional mode without needing to change cell layout of the DRAM. The DRAM operates in turn in its conventional sensing mode. Flow chart 600 terminates.

In summary, the invention provides a DRAM that is operable in a conventional sensing mode and a differential sensing mode. These two modes of sensing operation can be switched without needing to change the cell layout of the DRAM. Advantageously, the differential sensing mode allows the DRAM to perform at a faster speed.

Moreover, as compared to a static random access memory (SRAM), lower signal differential generated during read and slow write restore time in a conventional DRAM are two of the reasons for choosing SRAM over DRAM—even though SRAM takes up 10× more space than DRAM. Advantageously, with the speed improvement provided by the invention, the above two weaknesses of the conventional DRAM have also been overcome. Specifically, the DRAM in one embodiment of the invention is about 1.5× bigger than a conventional DRAM and 20% the size of an equivalent SRAM.

Thus, the invention improves random access cycle time and pause capability in DRAM. Specifically, the invention provides an improved DRAM that offers the size advantage of DRAM without sacrificing the speed. That is, the invention provides an improved DRAM that decreases the gap between its speed and SRAM's speed. Additionally, the invention provides an improved DRAM that does not have bad ratio of BL capacitance to cell capacitance. Furthermore, the invention provides an improved DRAM that is not difficult to control the initial charge sharing time to generate the required differential for proper sensing. Further still, the invention provides an improved DRAM that does not have problem with cell leakage to affect the stored 'one' and production ramp-up.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A DRAM system, said system comprising:
   a first capacitor coupled to a first word line (WL), said first capacitor further coupled via a first pass gate to a first bit line (BL);
   a second capacitor coupled to a second WL neighboring said first WL, said second capacitor further coupled via a second pass gate to a second BL neighboring said first BL, wherein said first capacitor and said second capacitor adapted to store complementary data bits for ensuring a 'zero' being stored in one of said first capacitor or said second capacitor and for ensuring a voltage level 'zero' being maintained on one of said first and said second BL's; and
   a sense amplifier (SA) operable in a differential sensing mode and a conventional sensing mode, said SA coupled to said first BL and second BL, wherein in said differential sensing mode said SA adapted to amplify a 'zero' and a 'one' unequally.

2. The system of claim 1, wherein said SA responds to said 'zero' faster than to said 'one.'

3. The system of claim 1, further comprising row address decoding adapted to turn on simultaneously said first WL and said second WL for storing said complementary data bits, said row address decoding performed without needing to change the cell layout of said DRAM system.

4. The system of claim 3, wherein said row address decoding is redefined to witch from said differential sensing mode to conventional sensing mode for turning on one WL at a time, said row address decoding redefined without needing to change the cell layout of said DRAM system.

5. The system of claim 1, wherein in said differential sensing mode said first capacitor and said second capacitor charge share and generate differential signal on said first BL and said second BL.

6. The system of claim 5, wherein said differential signal compensates for a poorly restored data value, thereby increasing write cycle time.

7. The system of claim 5, wherein said differential signal is at least twice the value that is available with 1 transistor/1 capacitor (1T1C) configured DRAM.

8. The system of claim 1, wherein, in said differential sensing mode, none of said first BL and said second BL maintains a BL reference voltage for generating a differential signal for said SA.

9. The system of claim 1, further comprising a pre-sense amplifier coupled to said SA and said first and second BL's, said pre-SA adapted to pre-amplify differential signal prior to said differential signal reaching said SA to be amplified, said pre-SA operable in said conventional sensing mode and said differential sensing mode.

10. The system of claim 1, further comprising a write driver coupled to said first and said BL's respectively via a first global bit line (GBL) and a second GBL, said write driver operable in a conventional driving mode and a differential driving mode.

11. A method for accessing a DRAM, said method comprising the steps of:
   a) defining row address decoding for allowing two neighboring WL's to be turned on simultaneously; switching to a differential mode without changing cell layout of said DRAM;
   b) turning on simultaneously a first WL and a second WL, said first WL neighboring said second WL; and c) storing complementary data bits using a first DRAM cell coupled to said first WL and a second DRAM cell coupled to said second WL to ensure . . .

d) maintaining voltage levels of said complementary data bits on said first BL and said second BL that are coupling respectively to said first and second DRAM cells, said first and second BL's coupled to a SA, wherein said first and second DRAM cells charge share and generate differential signal on said first and second complementary neighboring BL's.

12. The method of claim 11, wherein said differential signal is at least twice the value that is available with a 1T/1C configured DRAM.

13. The method of claim 11, wherein said differential signal compensates for a poorly restored value, thereby reducing write cycle time.

14. The method of claim 11, wherein said first and second complementary neighboring bit lines are coupled to a SA, said SA adapted to amplify a 'zero' and a 'one' unequally and biased toward reading a 'zero.'

15. The method of claim 11 further comprising the step of:

e) in response to a switch from differential sensing to conventional sensing, redefining said row address decoding such that only one word line is turned on at a time.

16. The method of claim 11, wherein said differential signal is at least twice the value that is available with 1 transistor/1 capacitor (1T/1C) configured DRAM.

17. The method of claim 11, wherein, in said differential sensing mode, none of said first BL and said second BL maintains a BL reference voltage.

18. A DRAM system operable in a differential mode, said DRAM system comprising:

a first cell;

a second cell, wherein said first cell and said second cell are adapted for storing complementary bits in said differential mode without changing cell layout of said DRAM system;

a first pass gate coupled to said first cell;

a second pass gate coupled to said second cell;

a first BL coupled to said first pass gate; and a second BL coupled to said second pass gate, wherein said first and said second BL's in said differential mode are adapted to maintain voltage levels corresponding to said complementary bits to ensure a 'zero' voltage level being maintained in one of said first and said second BL's while not changing cell layout of said DRAM system.

19. The DRAM system of claim 18, further comprising a SA coupled to said first BL and said second BL, said SA adapted amplify a 'one' and a 'zero' unequally.

20. The DRAM system of claim 19, wherein said SA amplifies a 'zero' faster than a 'one.'

21. The DRAM system of claim 18, filter comprising a switch for changing said differential mode of DRAM system to a conventional mode of DRAM system without changing cell layout of said DRAM system.

22. The DRAM system of claim 18, further comprising a pre-sense amplifier coupled to said SA and said first and second BL's, said pre-SA in said differential mode adapted to pre-amplify signal prior to said differential signal reaching said SA to be amplified, said pre-SA operable in said conventional sensing mode and said differential sensing mode.

23. The DRAM system of claim 18, further comprising a write driver coupled to said GBL's, said write driver operable in a conventional driving mode and a differential driving mode.

24. A method for improving DRAM access, said method comprising the steps of:

a) switching said DRAM from a conventional mode to a differential mode without needing to change cell layout of said DRAM;

b) ensuring that a 'zero' voltage level is maintained in a BL coupled to a SA.

25. The method of claim 24, wherein said step a) comprises the step of:

defining row address decoding adapted for turning on two neighboring WL's simultaneously.

26. The method of claim 24, wherein said step b) comprises the step of:

b1) representing data as complementary bits by storing said complementary bits respectively in a first DRAM cell and a second DRAM cell, said first DRAM cell coupled via a first pass gate to a first BL that couples to said SA, said second DRAM cell coupled via a second pass gate to a second BL that couples to said SA, b2) maintaining a 'zero' voltage level on one of said first BL and said second BL; and b3) maintaining a 'one' voltage level on the other one of said first and said second BL's.

27. The method of claim 26, wherein, by storing complementary bit of each other, said first DRAM cell and said second DRAM cell charge share and generate differential signal on said first and second BL's.

28. The method of claim 27, wherein said differential signal is at least twice the value that is available with a 1 transistor/1 capacitor (1T/1C) configured DRAM.

29. The method of claim 24, further comprising the step of:

c) sensing a 'zero' and a 'one' voltage levels unequally by said SA, said SA amplifying said 'zero' voltage level faster than said 'one' voltage level.

30. The method of claim 24, further comprising the step of:

d) in response to a need for said conventional mode, switching from said differential mode to said conventional mode without changing cell layout of said DRAM by defining row address decoding adapted for turning on one WL at a time.

* * * * *